(12) United States Patent
Kubo et al.

(10) Patent No.: US 9,491,890 B2
(45) Date of Patent: Nov. 8, 2016

(54) THERMALLY CONDUCTIVE BODY AND ELECTRONIC DEVICE USING SAME

(71) Applicant: PANASONIC CORPORATION, Osaka (JP)

(72) Inventors: Kazuhiko Kubo, Hokkaido (JP); Masafumi Nakayama, Hokkaido (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 9 days.

(21) Appl. No.: 14/372,645

(22) PCT Filed: Mar. 11, 2013

(86) PCT No.: PCT/JP2013/001552
§ 371 (c)(1),
(2) Date: Jul. 16, 2014

(87) PCT Pub. No.: WO2013/140741
PCT Pub. Date: Sep. 26, 2013

(65) Prior Publication Data
US 2014/0362532 A1    Dec. 11, 2014

(30) Foreign Application Priority Data
Mar. 19, 2012   (JP) .................................. 2012-061459

(51) Int. Cl.
*H05K 7/20*     (2006.01)
*F28F 3/00*     (2006.01)
(Continued)

(52) U.S. Cl.
CPC ............... *H05K 7/2039* (2013.01); *F28F 3/00* (2013.01); *H01L 23/36* (2013.01); *H01L 23/373* (2013.01); *H01L 23/3735* (2013.01); *H01L 2924/0002* (2013.01)

(58) Field of Classification Search
CPC . H01L 23/36; H01L 23/373; H01L 23/3735; H01L 2924/0002; F28F 3/00; F28F 21/02; F28F 2013/006; H05K 7/2039; H05K 2201/0323; A61L 31/024; H05B 3/145
USPC ................................. 165/135; 361/704, 713
See application file for complete search history.

(56) References Cited

U.S. PATENT DOCUMENTS 4,279,952 A * 7/1981 Kodama ................... B32B 9/04
                                                      156/155
4,820,170 A * 4/1989 Redmond ............. B29C 69/001
                                                      439/260

(Continued)

FOREIGN PATENT DOCUMENTS

JP       11-340673       12/1999
JP       2000-081143 A   3/2000
(Continued)

OTHER PUBLICATIONS

International Search Report issued in PCT/JP2013/001552, dated May 28, 2013, with English translation.

*Primary Examiner* — Courtney Smith
*Assistant Examiner* — Michael Matey
(74) *Attorney, Agent, or Firm* — McDermott Will & Emery LLP

(57) ABSTRACT

A thermally conductive body includes an insulating sheet, a first graphite sheet provided on a first surface of the insulating sheet, and a second graphite sheet provided on a second surface that is a reverse side of the first surface of the insulating sheet. Compressibility of the insulating sheet is lower than compressibility of the first graphite sheet and compressibility of the second graphite sheet.

7 Claims, 4 Drawing Sheets

(51) Int. Cl.
*H01L 23/36* (2006.01)
*H01L 23/373* (2006.01)

(56) References Cited

U.S. PATENT DOCUMENTS

| | | | | |
|---|---|---|---|---|
| 5,145,732 | A * | 9/1992 | Kyutoku | D01F 9/145 428/218 |
| 5,292,460 | A * | 3/1994 | Kyutoku | D01F 9/145 264/113 |
| 6,097,598 | A * | 8/2000 | Miyahara | H01L 23/3732 165/185 |
| 6,257,328 | B1 * | 7/2001 | Fujiwara | F28F 13/00 165/185 |
| 6,270,083 | B1 * | 8/2001 | Hirschvogel | F16J 15/22 277/536 |
| 7,419,722 | B2 * | 9/2008 | Ohta | H01L 23/373 165/185 |
| 8,673,446 | B2 * | 3/2014 | Tamaoki | C01B 31/04 423/448 |
| 2002/0135984 | A1 * | 9/2002 | Greenwood | H01L 23/4275 361/708 |
| 2005/0180113 | A1 * | 8/2005 | Shirakami | H01L 23/373 361/704 |
| 2006/0225874 | A1 * | 10/2006 | Shives | F28F 21/02 165/185 |
| 2007/0000642 | A1 * | 1/2007 | Yamazaki | H01L 23/3677 165/80.3 |
| 2007/0062676 | A1 * | 3/2007 | Yao | H01L 23/3675 165/104.33 |
| 2008/0286602 | A1 * | 11/2008 | Hasegawa | H01L 23/373 428/634 |
| 2008/0289810 | A1 * | 11/2008 | Okabayashi | B32B 27/00 165/185 |
| 2009/0301697 | A1 | 12/2009 | Hirose | |
| 2010/0132871 | A1 * | 6/2010 | Hattori | B32B 7/12 156/60 |
| 2010/0321897 | A1 * | 12/2010 | Hill | B29C 66/304 361/720 |
| 2011/0045300 | A1 | 2/2011 | Tamaoki et al. | |
| 2011/0141694 | A1 * | 6/2011 | Kamiguchi | H05K 7/20963 361/704 |

FOREIGN PATENT DOCUMENTS

| | | |
|---|---|---|
| JP | 2006-095935 | 4/2006 |
| JP | 2007-217206 A | 8/2007 |
| JP | 2008-192697 A | 8/2008 |
| JP | 2010-013340 A | 1/2010 |
| JP | 2010-070412 A | 4/2010 |
| JP | 2011-105531 A | 6/2011 |
| WO | 2006-112211 A1 | 10/2006 |

* cited by examiner

THERMALLY CONDUCTIVE BODY AND ELECTRONIC DEVICE USING SAME

RELATED APPLICATIONS

This application is the U.S. National Phase under 35 U.S.C. §371 of International Application No. PCT/JP2013/001552, filed on Mar. 11, 2013, which in turn claims the benefit of Japanese Application No. 2012-061459, tiled on Mar. 19, 2012, the disclosures of which Applications are incorporated by reference herein.

TECHNICAL FIELD

The present invention relates to a thermally conductive body used in various electronic devices, and an electronic device using the same.

BACKGROUND ART

Recently, with increase in functions, processing performance, and the like, of electronic devices, an amount of heat generated from electronic components such as a semiconductor element has been increased. In order to improve an operation property, reliability, and the like, of electronic components, a method of transferring heat by sandwiching a thermally conductive body between an electronic component as a heat generating body and a heat sink (a heat-dissipating plate) is used. FIG. 4 is a sectional view of a conventional thermally conductive body. Thermally conductive body 10 is formed by covering both sides of graphite sheet 1 having excellent thermal conductivity with insulating sheet 2. Insulating sheet 2 is used to keep an insulating property between a heat generating body (not shown) and a heat sink (not shown).

Note here that prior art literatures on the invention in accordance with the present application include, for example, Patent Literature 1.

CITATION LIST

Patent Literature

PTL 1: Japanese Patent Application Unexamined Publication No. 2011-105531

SUMMARY OF THE INVENTION

A thermally conductive body of the present invention includes an insulating sheet, a first graphite sheet provided on a first surface of the insulating sheet, and a second graphite sheet provided on a second surface that is a reverse side of the first surface of the insulating sheet. Compressibility of the insulating sheet is lower than compressibility of the first graphite sheet and compressibility of the second graphite sheet.

DESCRIPTION OF EMBODIMENTS

Hereinafter, a thermally conductive body in accordance with an exemplary embodiment of the present invention is described with reference to drawings.

Figure 1:
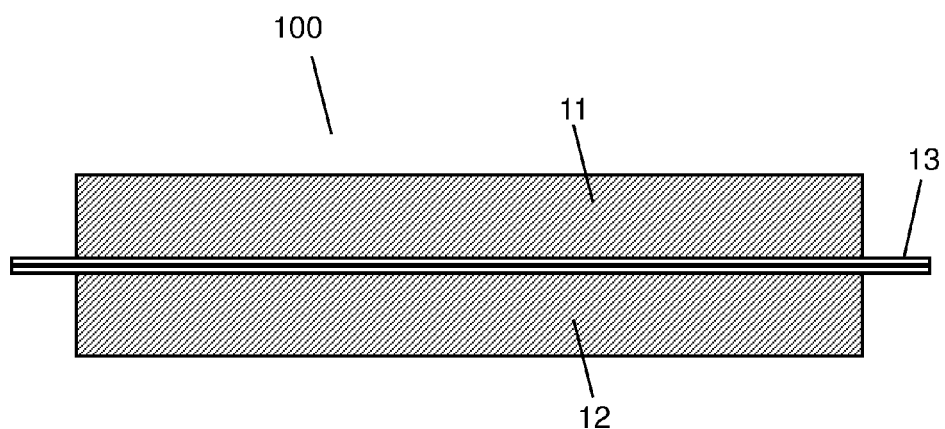
FIG. 1A is a sectional view of a thermally conductive body in accordance with an exemplary embodiment of the present invention.
FIG. 1B is a top view of the thermally conductive body in accordance with the exemplary embodiment of the present invention.
Figure 1:
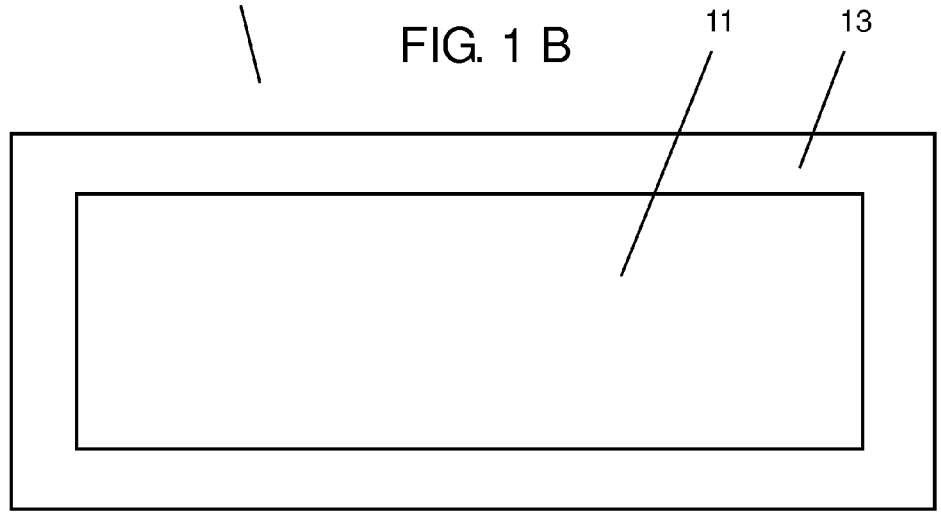

FIG. 1A is a sectional view of thermally conductive body 100 in accordance with this exemplary embodiment. FIG. 1B is a top view of thermally conductive body 100 in accordance with this exemplary embodiment. Thermally conductive body 100 includes insulating sheet 13, first graphite sheet 11 provided on a first surface of insulating sheet 13, and second graphite sheet 12 provided on a second surface that is a reverse side of the first surface of insulating sheet 13. Insulating sheet 13 is formed by coating an adhesive agent including acrylic resin on both surfaces of a polyethylene terephthalate sheet. A thickness of first graphite sheet 11 is about 70 μm, a thickness of second graphite sheet 12 is about 70 μm, a thickness of polyethylene terephthalate is about 2 μm, and a thickness of the adhesive agent is about 4 μm.

A pyrolytic graphite sheet, which is graphitized by thermally decomposing and carbonizing a resin film of, for example, polyimide, followed by heat treatment at a high temperature, is used as first and second graphite sheets 11 and 12.

First and second graphite sheets 11 and 12 have an air space inside thereof and have compressibility of about 15%. Herein, the compressibility is defined as $(t0-t1)/t0$ in which $t1$ is a thickness when a pressure of 2 kg-wt/cm$^2$ is applied to a sheet having thickness $t0$. On the other hand, since polyethylene terephthalate is used for insulating sheet 13, the compressibility of insulating sheet 13 is less than 1%. That is to say, the compressibility of insulating sheet 13 is much lower than that of first and second graphite sheets 11 and 12.

Figure 2:
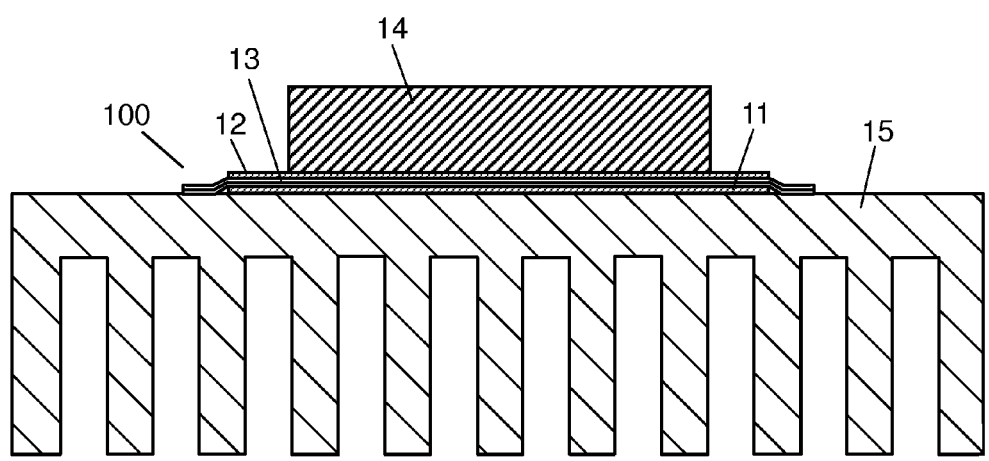
FIG. 2 is a sectional view of an electronic device using the thermally conductive body in accordance with the exemplary embodiment of the present invention.

Next, a use state of the thermally conductive body is described. FIG. 2 is a sectional view of an electronic device using thermally conductive body 100 in accordance with this exemplary embodiment. Thermally conductive body 100 is sandwiched between heat generating body 14 such as a semiconductor element and heat sink 15 made of aluminum. Heat generating body 14 is brought into direct contact with second graphite sheet 12, and heat sink 15 is brought into direct contact with first graphite sheet 11.

Although heat generating body 14 is locally heated to high temperatures, since heat generating body 14 is brought into direct contact with second graphite sheet 12, heat spreads throughout second graphite sheet 12 rapidly. The heat is transferred to first graphite sheet 11 via insulating sheet 13, and dissipated from heat sink 15.

Figure 4:
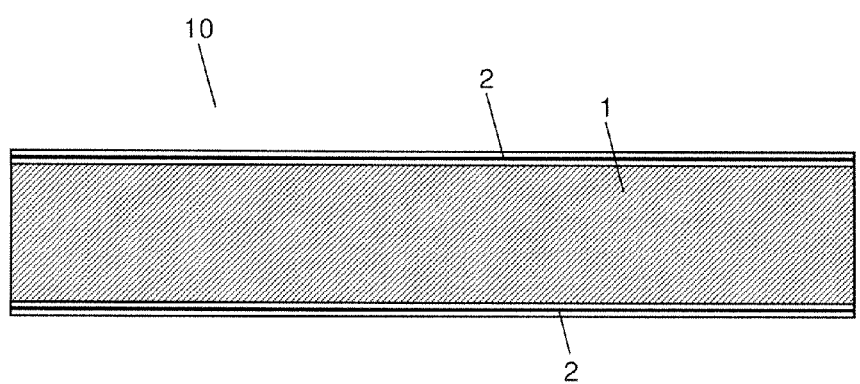
FIG. 4 is a sectional view of a conventional thermally conductive body.

In a conventional thermally conductive body 10 shown in FIG. 4, insulating sheet 2 is attached to the both surfaces of graphite sheet 1. That is to say, insulating sheet 2 is brought into contact with a heat generating body and a heat sink. Therefore, thermal resistance (contact thermal resistance) is increased in a portion in which insulating sheet 2 is brought into contact with the heat generating body or the heat sink, thus making it difficult to transfer heat as a whole (deteriorating a heat transferring efficiency).

However, in thermally conductive body 100, insulating sheet 13 is sandwiched between first graphite sheet 11 and second graphite sheet 12. First graphite sheet 11 is brought into contact with heat sink 15, and second graphite sheet 12 is brought into contact with heat generating body 14.

First graphite sheet 11 is easily deformed due to its high compressibility and adheres to heat sink 15. Therefore, the contact thermal resistance between first graphite sheet 11 and heat sink 15 can be reduced. Furthermore, second graphite sheet 12 is also easily deformed due to its high compressibility and adheres to heat generating body 14. Therefore, the contact thermal resistance between second graphite sheet 12 and heat generating body 14 can be reduced.

Furthermore, insulating sheet 13 having low compressibility and being hard is sandwiched between first graphite sheet 11 and second graphite sheet 12 having high compressibility. Therefore, even when a pressure is applied, the shape of the whole of thermally conductive body 100 is maintained and the insulation property in a thickness direction can be secured.

That is to say, one surface of the graphite sheet (first graphite sheet 11 or second graphite sheet 12) is brought into contact with heat generating body 14 or heat sink 15, and the other surface is supported by insulating sheet 13 having lower compressibility than that of the graphite sheet. With this configuration, since the graphite sheet and heat generating body 14 or heat sink 15 adhere to each other when a pressure is applied, the contact thermal resistance can be reduced.

In order to allow first graphite sheet 11 to adhere to heat sink 15 and allow second graphite sheet 12 to adhere to heat generating body 14, respectively, the compressibility of first graphite sheet 11 and the compressibility of second graphite sheet 12 are desirably not less than 10%. Furthermore, from the viewpoint of handling of thermally conductive body 100, the compressibility of first graphite sheet 11 and the compressibility of second graphite sheet 12 are desirably not more than 50%. In addition, it is desirable that the compressibility of insulating sheet 13 is not more than one-tenth of the compressibility of first graphite sheet 11 and the compressibility of second graphite sheet 12. Furthermore, when first graphite sheet 11 and second graphite sheet 12 are made to be thicker than insulating sheet 13, adhesion is further improved.

Herein, it is desirable that an area in a top view of insulating sheet 13 is larger than that of first graphite sheet 11 and second graphite sheet 12. That is to say, as shown in FIG. 1B, it is desirable that in a cross section in a direction in which first graphite sheet 11, insulating sheet 13 and second graphite sheet 12 are laminated, insulating sheet 13 extends off at the whole periphery.

Thus, the insulation property (that is to say, the insulation property in the thickness direction) of heat generating body 14 and heat sink 15 can be secured.

In addition, it is desirable that the peripheral part of insulating sheet 13 is attached to heat sink 15. Thus, the contact thermal resistance between first graphite sheet 11 and heat sink 15 can be further reduced.

Figure 3:
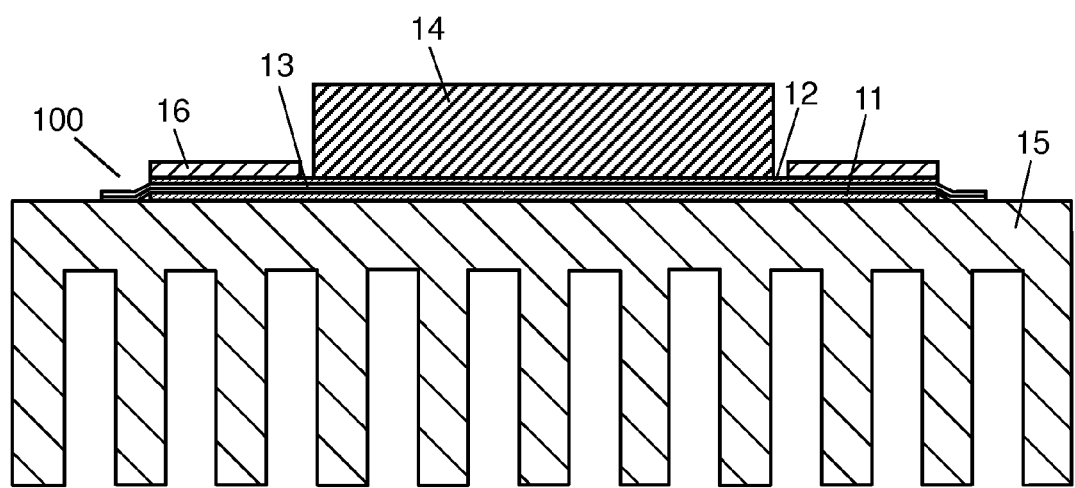
FIG. 3 is a sectional view of another electronic device using the thermally conductive body in accordance with the exemplary embodiment of the present invention.

FIG. 3 is a sectional view of another electronic device using thermally conductive body 100 in accordance with this exemplary embodiment. In this configuration, protective film 16 is provided on a surface, in which second graphite sheet 12 is brought into contact with heat generating body 14, in a region with which second graphite sheet 12 is not brought into contact. That is to say, the protective film is formed on a part of the second graphite sheet. When a part of second graphite sheet 12 is covered with protective film 16, a region in which second graphite sheet 12 is exposed can be reduced, thus improving the reliability.

Furthermore, since protective film 16 is not provided in a region in which second graphite sheet 12 is brought into contact with heat generating body 14, heat generating body 14 is brought into direct contact with second graphite sheet 12, and thus the contact thermal resistance therebetween can be reduced.

Note here that this exemplary embodiment describes a case in which a single layer of an insulating sheet is provided. However, a plurality of graphite sheets and insulating sheets may be laminated alternately. In this case, a configuration may be employed, in which a part that is brought into contact with a heat generating body or a heat sink is a graphite sheet, and a part opposite to the contact graphite sheet is made of an insulating sheet having lower compressibility than that of the graphite sheet.

As mentioned above, when thermally conductive body 100 in accordance with this exemplary embodiment is used, the contact thermal resistance can be reduced while the insulation property between heat generating body 14 and heat sink 15 can be secured.

INDUSTRIAL APPLICABILITY

A thermally conductive body of the present exemplary embodiment is excellent in the thermal conductivity and insulation property in a thickness direction, and is industrially applicable.

REFERENCE MARKS IN THE DRAWINGS

11 first graphite sheet
12 second graphite sheet
13 insulating sheet
14 heat generating body
15 heat sink
16 protective film
100 thermally conductive body

The invention claimed is:
1. A thermally conductive body comprising:
    an insulating sheet;
    a first graphite sheet provided on a first surface of the insulating sheet; and
    a second graphite sheet provided on a second surface that is a reverse side of the first surface of the insulating sheet,
    wherein compressibility of the insulating sheet is lower than compressibility of the first graphite sheet and compressibility of the second graphite sheet,
    an area in a top view of the insulating sheet is larger than an area of the first graphite sheet and an area of the second graphite sheet, and
    the first graphite sheet and the second graphite sheet are electrically insulated from each other by the insulating sheet.
2. The thermally conductive body of claim 1, wherein the compressibility of the first graphite sheet and the compressibility of the second graphite sheet are not less than 10% and not more than 50%.
3. The thermally conductive body of claim 1, wherein the compressibility of the insulating sheet is not more than one-tenth of the compressibility of the first graphite sheet and the compressibility of the second graphite sheet.

4. The thermally conductive body of claim 1, wherein the first graphite sheet and the second graphite sheet are thicker than the insulating sheet.

5. The thermally conductive body of claim 1, further comprising a protective film in a part of the second graphite sheet.

6. An electronic device comprising:
a thermally conductive body of claim 1;
a heat sink brought into direct contact with the first graphite sheet of the thermally conductive body; and
a heat generating body brought into direct contact with the second graphite sheet of the thermally conductive body.

7. The electronic device of claim 6, wherein a protective film is formed on the second graphite sheet in a region with which the heat generating body is not brought into contact.

* * * * *